United States Patent
Oshima et al.

(10) Patent No.: US 10,049,452 B2
(45) Date of Patent: *Aug. 14, 2018

(54) INFORMATION PROCESSING APPARATUS, INFORMATION PROCESSING METHOD, AND CELL ANALYSIS SYSTEM

(71) Applicant: Sony Corporation, Tokyo (JP)

(72) Inventors: Shiori Oshima, Kanagawa (JP); Kazuhiro Nakagawa, Saitama (JP); Eriko Matsui, Tokyo (JP)

(73) Assignee: Sony Corporation, Tokyo (JP)

( * ) Notice: Subject to any disclaimer, the term of this patent is extended or adjusted under 35 U.S.C. 154(b) by 130 days.

This patent is subject to a terminal disclaimer.

(21) Appl. No.: 15/198,105

(22) Filed: Jun. 30, 2016

(65) Prior Publication Data

US 2016/0307320 A1    Oct. 20, 2016

Related U.S. Application Data

(63) Continuation of application No. 14/173,358, filed on Feb. 5, 2014, now Pat. No. 9,412,179.

(30) Foreign Application Priority Data

Feb. 14, 2013 (JP) .................................. 2013-027045
Sep. 5, 2013 (JP) .................................. 2013-184034

(51) Int. Cl.
*G06T 7/00* (2017.01)
*G06T 7/20* (2017.01)
(Continued)

(52) U.S. Cl.
CPC ............ *G06T 7/0016* (2013.01); *G01R 23/16* (2013.01); *G06K 9/0014* (2013.01);
(Continued)

(58) Field of Classification Search
CPC .. G06T 7/20; G06T 2207/30004; G01R 23/16
See application file for complete search history.

(56) References Cited

U.S. PATENT DOCUMENTS 6,263,089 B1 * 7/2001 Otsuka .................... G06T 7/60
382/107
6,679,847 B1 * 1/2004 Robinson ............ G01S 7/52028
600/447

(Continued)

FOREIGN PATENT DOCUMENTS

JP     H10-73573 A       3/1998
JP     2006-525210       11/2006
(Continued)

OTHER PUBLICATIONS

Chinese Office Action (with English translation) dated Jul. 29, 2016 in corresponding Chinese application No. 2014100453139 (16 pages).

(Continued)

*Primary Examiner* — Utpal Shah
(74) *Attorney, Agent, or Firm* — K&L Gates LLP

(57) ABSTRACT

An information processing apparatus, an information processing method, and a cell analysis system are provided. The information processing apparatus includes a processor configured to: determine a frequency feature value based on motion data from an image of a cell, and control displaying information associated with the frequency feature value, wherein the frequency feature value includes a power spectral density for each time range and each frequency band, and wherein the information associated with the frequency feature value is displayed in association with the each time range and the each frequency band.

19 Claims, 21 Drawing Sheets

(51) Int. Cl.
  *G01R 23/16* (2006.01)
  *G06K 9/00* (2006.01)
  *G06T 7/246* (2017.01)
  *G06T 7/262* (2017.01)

(52) U.S. Cl.
  CPC ............ *G06K 9/00127* (2013.01); *G06T 7/20* (2013.01); *G06T 7/246* (2017.01); *G06T 7/262* (2017.01); *G06T 2207/10016* (2013.01); *G06T 2207/30004* (2013.01); *G06T 2207/30024* (2013.01)

(56) References Cited

U.S. PATENT DOCUMENTS

| | | | | |
|---|---|---|---|---|
| 8,064,638 | B2* | 11/2011 | Fujibayashi | G06T 7/0002 382/103 |
| 9,005,142 | B2* | 4/2015 | Teicher | A61B 5/7282 600/595 |
| 2011/0245673 | A1* | 10/2011 | Kamiyama | A61B 8/08 600/443 |
| 2013/0028489 | A1* | 1/2013 | Tracton | G06K 9/00536 382/128 |
| 2013/0070971 | A1 | 3/2013 | Kunihiro et al. | |
| 2013/0150717 | A1* | 6/2013 | Sato | A61B 8/06 600/441 |

FOREIGN PATENT DOCUMENTS

| | | |
|---|---|---|
| JP | 2006-350739 A | 12/2006 |
| JP | 2011-060227 A | 3/2011 |
| JP | 2011-188860 | 9/2011 |
| JP | 2012-105631 | 6/2012 |
| JP | 2012-198140 A | 10/2012 |
| WO | 2011/122200 A1 | 10/2011 |
| WO | 2012-118049 A1 | 9/2012 |

OTHER PUBLICATIONS

Yuan, Guowu, Research on Moving Objects Detection and Tracking Methods in Intelligent Visual Surveillance System, China Doctoral Dissertations Full-Text Database, published Oct. 15, 2012 (3 pages).

Hayakawa, Tomohiro et al., Noninvasive Evaluation of Contractile Behavior of Cardiomyocyte Monolayers Based on Motion Vector Analysis, Tissue Engineering: Part C, vol. 18, No. 1, published Jan. 4, 2012 (12 pages).

Cutler, Ross et al., Robust Real-Time Periodic Motion Detection, Analysis, and Applications, Pattern Analysis and Machine Intelligence, published Aug. 31, 2000 (25 pages).

Japanese Office Action dated Jan. 24, 2017 in corresponding Japanese application No. 2013-184034 (6 pages).

Second Japanese Office Action dated Aug. 8, 2017 in corresponding Japanese application No. 2013-184024 (6 pages).

Japanese Office Action dated Dec. 26, 2017 for corresponding Japanese application No. 2013-184034; (2 pages).

* cited by examiner

| Movie No. | Motion | | | | FFT | | |
|---|---|---|---|---|---|---|---|
| | Average | Max | Min | SD | Average | Peak | MPF |
| 121029iPS_Neuror | 9.7163 | 15.105 | 0.8 | 2.3102 | 718.96 | 7 | 15.6 |
| 121029iPS_Neuror | 3.0788 | 6.5609 | 0.2 | 1.4601 | 1102.9 | 2 | 15.2 |
| 121029iPS_Neuror | 16.798 | 29.222 | 0.7 | 6.9053 | 654.39 | 0 | 12.333 |

| Image 1 | Result | |
|---|---|---|
| | | |
| | | |

INFORMATION PROCESSING APPARATUS, INFORMATION PROCESSING METHOD, AND CELL ANALYSIS SYSTEM

CROSS REFERENCES TO RELATED APPLICATIONS

The present application is a continuation of U.S. patent application Ser. No. 14/173,358, filed Feb. 5, 2014, which claims priority to Japanese Priority Patent Application JP 2013-027045 filed in the Japan Patent Office on Feb. 14, 2013, and Japanese Priority Patent Application JP 2013-184034 filed in the Japan Patent Office on Sep. 5, 2013, the entire content of which is hereby incorporated by reference.

BACKGROUND

The present disclosure relates to an analyzing system, an analyzing program and an analyzing method for analyzing a video image of a target of analysis imaged over time.

With the creation of iPS cells (see, for reference, Japanese Patent Application Laid-Open No. 2011-188860), significant progress has been made in the field of regenerative medicine, tissue engineering, cell engineering and the like. As a result, there is a growing demand for evaluation of the state of cells and evaluation of a drug's effect and impact on cells. In particular, regarding nerve cells, a method for making nerve cells out of embryonic stem cells such as iPS cells has been established (see, for reference, Japanese Patent Application Laid-Open No. 2006-525210), and there is a demand for effective methods for analyzing nerve cells.

As a method for analyzing cells, the method of analyzing a video image of the cells as a target of analysis imaged over time, and analyzing the cells based on information obtainable from that, has been studied. For example, an image processor which detects motion vectors in a video image containing some cells and evaluates the cooperativity of movement of the cells contained in the video image has been disclosed in Japanese Patent Application Laid-Open No. 2012-105631 (hereinafter referred to as Patent Document 1).

SUMMARY

However, the image processor as described in Patent Document 1 has been configured to calculate one evaluation value from the video image, but has not been able to evaluate the movement of the cells in the video image over time. The present inventors have newly found an analytical technique which is capable of evaluating movement of a target of analysis over time, in a video image of the target of analysis such as cells imaged over time.

In view of the above-mentioned circumstances, it is desirable to provide an analyzing system, an analyzing program and an analyzing method capable of evaluating movement of a target of analysis over time, from a video image of the target of analysis imaged over time.

According to an embodiment of the present disclosure, there is provided an analyzing system including a feature value calculation unit.

The feature value calculation unit is configured to calculate, for each time range, a feature value indicating a feature of an amount of movement in a target video image in which a target of analysis is imaged over time.

The amount of movement (motion vector) in the target video image varies depending on movement of the target of analysis contained in the target video image. The feature value for each time range represents a feature of the amount of movement for that time range. Accordingly, it is possible to evaluate temporal change of the amount of movement using the feature value as an index, which enables the evaluation of motion of the target of analysis.

The analyzing system may further include a feature value display unit configured to visualize temporal change or spatial change of the feature value.

This configuration allows a user to use the visualized temporal change or spatial change of the feature value, to thereby evaluate the movement of the target.

The analyzing system may include a feature value display unit configured to visualize temporal change of the feature value and superimpose the visualized temporal change of the feature value on the target video image to form a feature value-displaying video image.

The feature value-displaying video image displays the target video image as well as the feature value varying with the target video image. This allows a user to observe the target video image by referring to the feature of the amount of movement which is represented by the feature value.

The analyzing system may further include a range-specifying unit configured to specify a certain range of the target video image as a calculation range. The feature value calculation unit may calculate the feature value for each calculation range.

With this configuration, the feature value may be calculated for each certain range (calculation range) of the target video image. This allows evaluating the motion of the target of analysis for each of the ranges. The calculation range may be a range specified by a user, or may be a range of the target video image divided into a plurality of ranges.

The feature value may be at least one selected from the group consisting of mean value, maximum value, minimum value, standard deviation, variance, and variation coefficient of amounts or directions of movement; a frequency feature value; or a combination thereof.

Since each of the above-mentioned various feature values represents the feature of the amount of movement, it is possible to evaluate the motion of the target of analysis using these feature values as an index. Incidentally, this may use one or more of these feature values. As different characteristics of the amount of movement are represented by different kinds of feature values, it is possible to select an appropriate feature value depending on the motion of the target of analysis to evaluate.

The frequency feature value may be mean intensity, peak frequency or mean power frequency, obtained from a frequency domain analysis.

The above-mentioned various frequency feature values include information related to frequencies of the amount of movement, which can be obtained from a frequency domain analysis such as fast Fourier transform (FFT), wavelet transform, and maximum entropy method (MEM). Accordingly, by using these feature values as an index, it is possible to evaluate the motion of the target of analysis in terms of frequencies of the amount of movement. Incidentally, this may use one or more of these feature values.

The target of analysis may be a nerve cell.

The movement (oscillation, etc.) of nerve cells is likely to be influenced by the kind of stimulus (inhibitory, excitatory, etc.) being applied to the nerve cells and by the state of the formation of neuronal networks. However, the movement of nerve cells is very small compared to pulsation of cardiomyocytes and the like, and it demands higher accuracy in the analysis. As the analyzing system is able to evaluate the motion of the cells with high accuracy using the feature value as an index, nerve cells may be a suitable target of analysis using this analyzing system.

The analyzing system may further include an object region specifying unit.

The object region specifying unit is configured to specify an analysis object region in a still image included in the target video image. The analysis object region is a region where the target of analysis exists.

In this case, the feature value calculation unit may calculate the feature value for the analysis object region in the target video image.

This configuration allows the feature value calculation unit to calculate the feature value of only the region where the target of analysis (cells, etc.) exists, in the target video image. Since this does not calculate the feature value of the regions where the target of analysis does not exist (intervals between the cells, etc.) in the target video image, the feature value calculation unit can calculate the feature value at high speed and can also prevent generation of noise.

The feature value calculation unit may calculate the feature value in the analysis object region using a movement-containing region. The movement-containing region is a region that has a motion velocity equal to or greater than a threshold.

The movement-containing region is a region with the motion velocity equal to or greater than a certain threshold, that is, a part with a large movement, of the target of analysis. Some targets of analysis may have a large movement in only a specific part thereof (for example, neurites in nerve cells). With the feature value calculation unit identifying the movement-containing region, it is able to extract the motion of the part having a large movement and analyze the motion.

The feature value calculation unit may calculate, as the feature value, a ratio of the movement-containing region to the analysis object region.

The ratio of the movement-containing region indicates how much of the analysis object region is the movement-containing region, and this represents a tendency of movement in the target of analysis. This enables one to determine that, for example, in cases where the ratio of the movement-containing region is large, the whole target of analysis (cells, etc.) is oscillating; and in cases where the ratio of the movement-containing region is small, a specific part of the target of analysis is oscillating.

The feature value calculation unit may calculate, as the feature value, a mean value of motion velocities of the analysis object region.

The mean value of the motion velocities of the analysis object region represents overall movement of the target of analysis. By averaging the motion velocities of the region limited to the analysis object region, it can avoid averaging the motion velocities of the regions where the target of analysis does not exist (intervals between the cells, etc.).

The feature value calculation unit may calculate, as the feature value, a mean value of motion velocities of the movement-containing region.

The mean value of motion velocities of the movement-containing region represents the motion velocity of some moving parts of the target of analysis. For example, in cases where only a specific part in the target of analysis is vigorously oscillating, this enables one to determine the motion velocity of this specific part alone. If a mean value of the motion velocities of the whole target of analysis was to be calculated, the motion velocities of some parts without oscillation would be averaged with it. In contrast to this, the above-mentioned configuration is capable of analyzing in such cases.

The feature value calculation unit may calculate, as a frequency feature value, an area of a predetermined frequency band of a power spectral density obtained from a frequency domain analysis of the amount of movement.

With this configuration, since the data of the oscillation at a predetermined frequency band is extracted as the feature value, it is possible to analyze the frequency band which is limited to that of a point of interest in the target of analysis (for example, neurites in nerve cells). In other words, oscillations other than that of the frequency band of interest are able to be omitted from the target to be analyzed, and as a result, even in cases where the target of analysis has some oscillations at a plurality of frequencies, the analysis can effectively be performed.

According to another embodiment of the present disclosure, there is provided an analyzing program which causes a computer to function as a feature value calculation unit.

The feature value calculation unit is configured to calculate, for each time range, a feature value indicating a feature of an amount of movement in a target video image in which a target of analysis is imaged over time.

According to still another embodiment of the present disclosure, there is provided an analyzing method which includes calculating, for each time range, a feature value indicating a feature of an amount of movement in a target video image in which a target of analysis is imaged over time.

As described above, the embodiments of the present disclosure make it possible to provide an analyzing system, an analyzing program and an analyzing method capable of evaluating movement of a target of analysis over time, from a video image of the target of analysis imaged over time.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

BRIEF DESCRIPTION OF THE FIGURES

FIG. 11 shows an example of a feature value table displayed by the feature value display unit of the analyzing system;

DETAILED DESCRIPTION

Hereinafter, some embodiments of the present disclosure will be described with reference to the drawings.

First Embodiment

An analyzing system according to a first embodiment of the present disclosure will be described.

Figure 1:
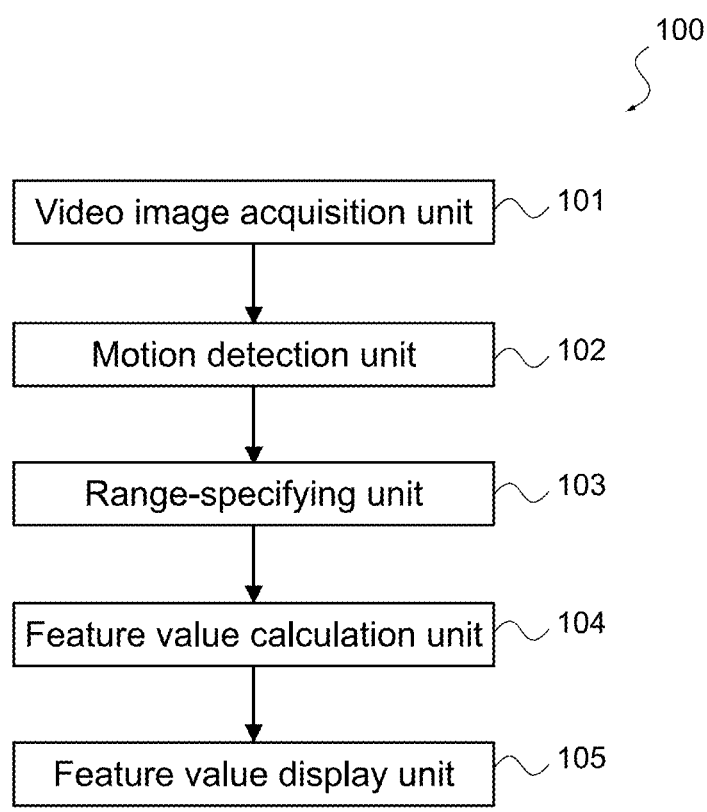
FIG. 1 is a schematic diagram showing a configuration of an analyzing system according to a first embodiment of the present disclosure.
Figure 2:
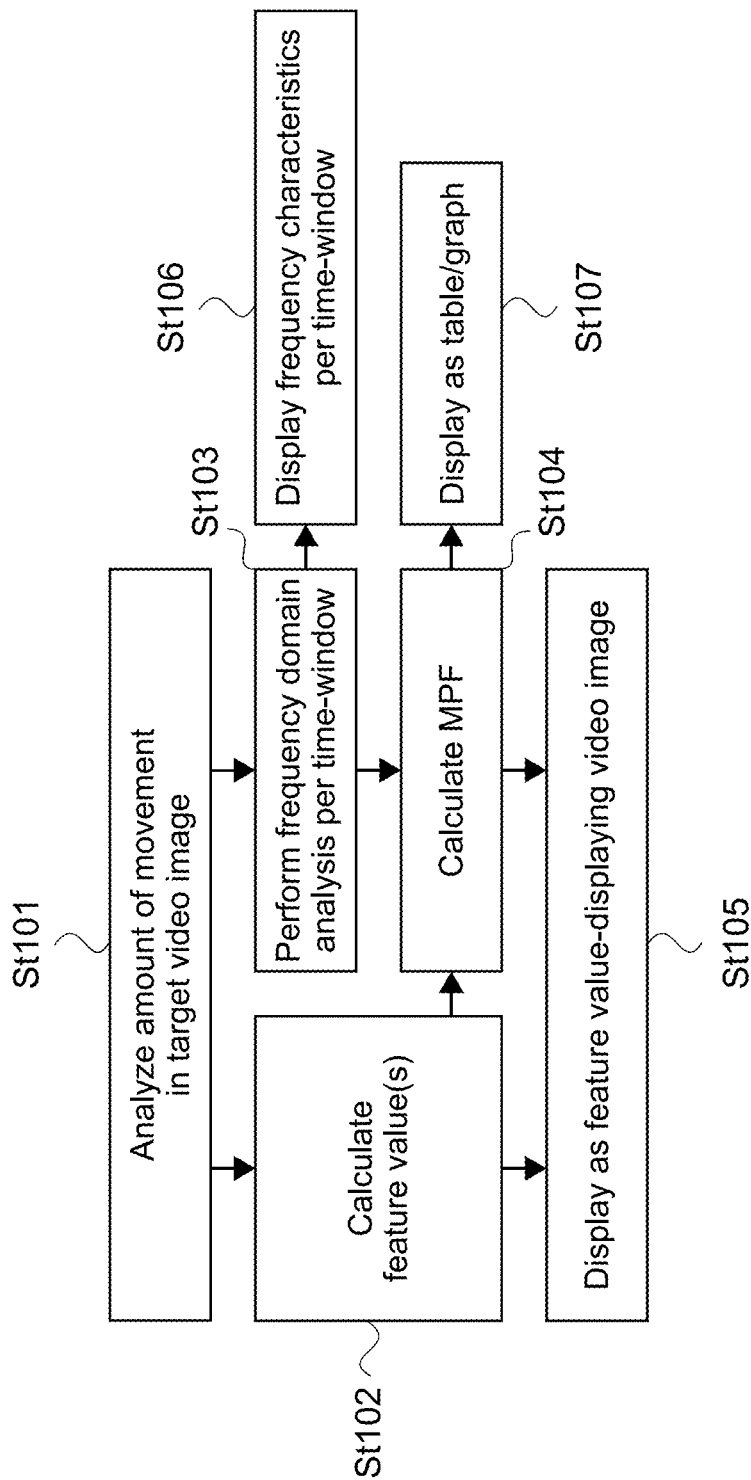
FIG. 2 is a flowchart showing an operation of the analyzing system.

FIG. 1 is a schematic diagram showing a configuration of an analyzing system 100 according to the embodiment. FIG. 2 is a flowchart showing an operation of the analyzing system 100. As shown in FIG. 1, the analyzing system 100 includes a video image acquisition unit 101, a motion detection unit 102, a range-specifying unit 103, a feature value calculation unit 104 and a feature value display unit 105. The analyzing system 100 may have a functional configuration realized by an information processor. It may be realized by a single information processor or a plurality of information processors connected via a network.

The video image acquisition unit 101 obtains a "target video image" which is a video image to analyze. A nonlimiting example of "target video image" is a video image of a cell or a group of cells as a target of analysis being imaged over time. The video image may include a video image made up of a plurality of frames continuously imaged, or still images from time-lapse imaging. The target video image may be obtained at a rate set appropriately depending on the target of analysis. In cases where the target of analysis is nerve cells, the rate may be 50 fps (frame/sec) or lower, and may be, for example, 1 fpm (frame/min). In cases where the target of analysis is cardiomyocytes, the rate may be 150 fps or more.

The target video image may be a video image obtained by imaging using any of various optical imaging methods such as bright-field imaging, dark-field imaging, phase difference imaging, fluorescence imaging, confocal imaging, multiphoton excitation fluorescence imaging, absorbed light imaging and scattered light imaging.

Figure 3:
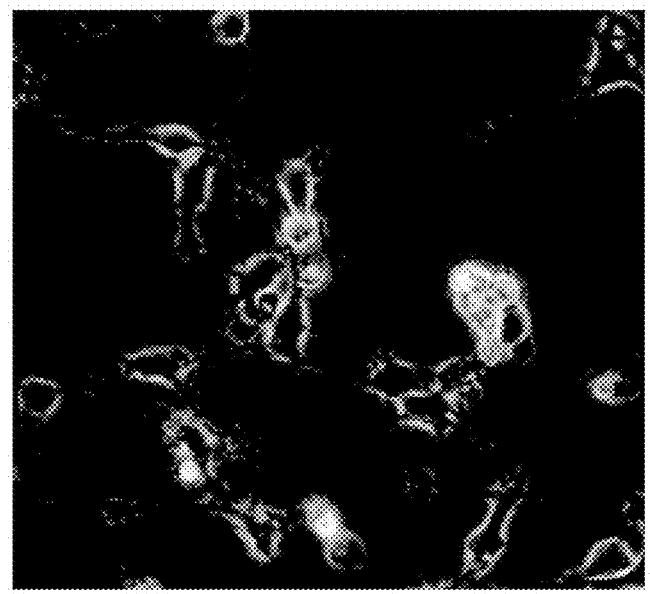
FIG. 3 shows an example of a target video image that a video image acquisition unit of the analyzing system obtains.

FIG. 3 shows an example of the target video image which is a video image containing a plurality of nerve cells. The video image acquisition unit 101 may obtain the target video image from an imaging apparatus (microscopic imaging apparatus) (not shown in the drawing), or, it may obtain as the target video image a video image stored in storage or a video image provided from a network. At this time, the video image acquisition unit 101 may obtain the target video image by sampling, at a predetermined period depending on type of the target of analysis, from the video images which have been imaged in advance. The video image acquisition unit 101 provides the obtained target video image to the motion detection unit 102.

The motion detection unit 102 detects an "amount of movement" (motion vector) in the target video image (FIG. 2, St101). The amount of movement may include amounts and directions of movement over time, of each pixel or group of pixels corresponding with one another between some frames included in the target video image. The amount of movement can be detected by an image-processing technique such as block matching. The motion detection unit 102 provides the detected amount of movement to the range-specifying unit 103.

Figure 4:
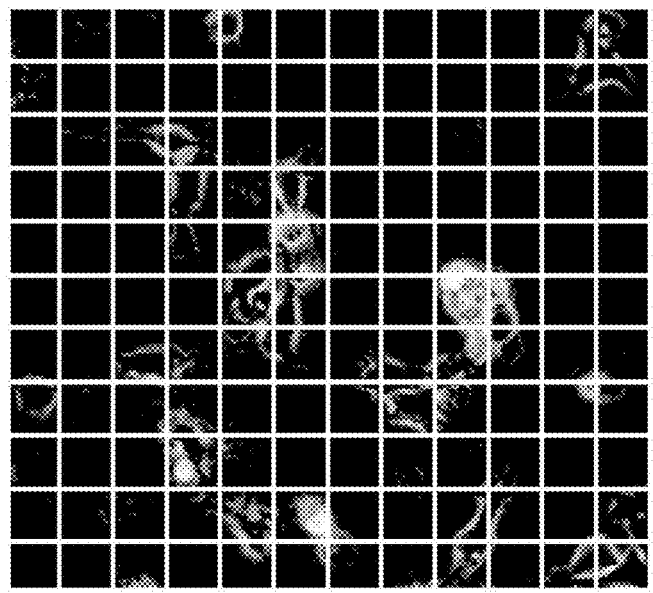
FIG. 4 shows an example of calculation ranges that the range-specifying unit of the analyzing system specifies.

The range-specifying unit 103 specifies a "calculation range" in the target video image. The calculation range is a range for calculating a feature value, which will be described later, in the target video image. One or more calculation ranges may be provided. FIG. 4 shows an example of calculation ranges specified in the target video image. Each range sectioned by the white lines is the calculation range.

The range-specifying unit 103 may specify as the calculation range a range instructed by a user, or may specify a predetermined range as the calculation range. The predetermined range may be, for example, as shown in FIG. 4, the ranges of the target video image being divided into many parts (for example, 10×10). The range-specifying unit 103 may also specify the whole part of the target video image as the calculation range. The range-specifying unit 103 provides the calculation range, and the amount of movement for each calculation range, to the feature value calculation unit 104.

Figure 5:
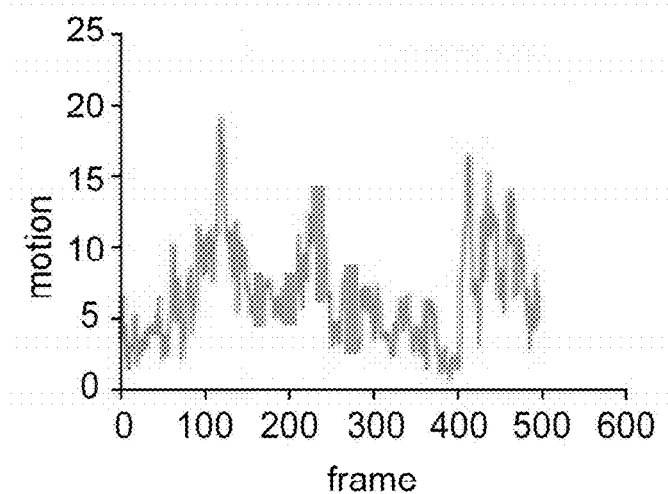
FIG. 5 shows an example of a time-motion waveform calculated by a feature value calculation unit of the analyzing system.

The feature value calculation unit 104 calculates a "feature value" for each calculation range (FIG. 2, St102). The feature value is a value indicating a feature of the amount of movement for each time range, in the target video image. The time range may be a constant time range or a variable time range. As a specific example, the feature value calculation unit 104 calculates, from the amount of movement for each calculation range, a time-motion waveform which represents a temporal change of the amount of movement. FIG. 5 is an example of the time-motion waveform where the abscissa (frame) represents the frame of the target video image and the ordinate (motion) represents the amount of movement.

The feature value calculation unit 104 may calculate the feature value by using the time-motion waveform. Specific examples of the feature values include a pulsating area (area of the cells), and mean value, maximum value, minimum value, standard deviation, variance, and variation coefficient of amounts or directions of movement. The feature value calculation unit 104 continuously calculates the feature value while moving the time range to calculate the feature value in the time-motion waveform. The time range to calculate the feature value may be set appropriately depending on type of the feature value, motion of the target of analysis, or the like.

Figure 6:
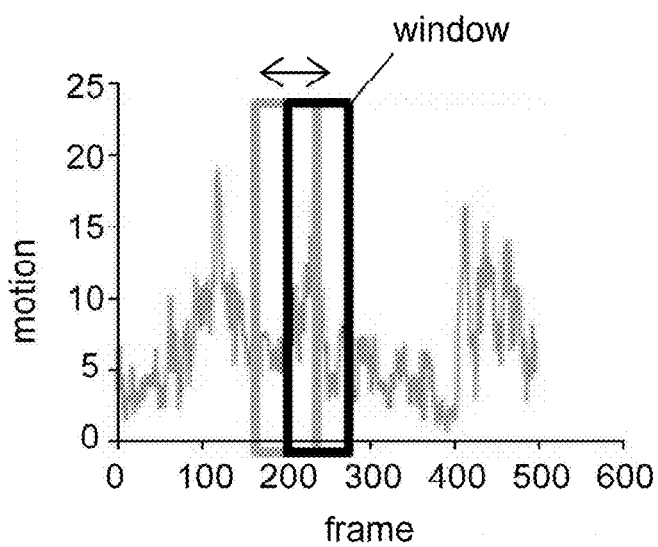
FIG. 6 is a schematic diagram showing a method for calculating a feature value by the feature value calculation unit of the analyzing system.

Further, the feature value may include a "frequency feature value". The feature value calculation unit 104 may calculate the frequency feature value by performing a frequency domain analysis of the time-motion waveform. FIG. 6 is a figure showing a method for calculating the feature value by the feature value calculation unit 104. The feature value calculation unit 104, after pre-processing such as removing DC (direct current) component and performing fitting in advance, may set a time-window (window) in the time-motion waveform as shown in FIG. 6.

Figure 7:
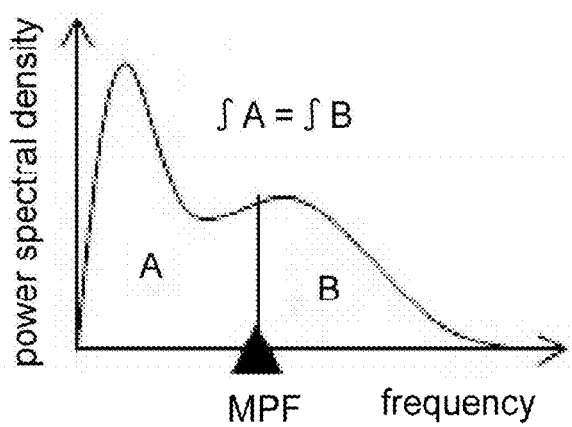
FIG. 7 is a schematic diagram showing a power spectral density calculated by the feature value calculation unit of the analyzing system.

The feature value calculation unit 104 performs fast Fourier transform (FFT) analysis of the waveform within the time-window while moving the time-window (FIG. 2, St103) and calculates a power spectral density (PSD) from the result of the analysis. FIG. 7 shows an example of the power spectral density.

The feature value calculation unit 104 may calculate mean intensity, peak frequency, mean power frequency (MPF) or the like, which can be obtained from the frequency domain analysis, as the frequency feature value (FIG. 2, St104). Examples of the frequency domain analysis techniques include various frequency domain analysis techniques such as fast Fourier transform (FFT), wavelet transform, and maximum entropy method (MEM). Incidentally, MPF is a frequency which would divide the power spectral density into two parts of equal area. FIG. 7 shows the MPF at which the area A and the area B are equal. The feature value calculation unit 104 provides the calculated feature to the feature value display unit 105. It should be noted that the feature value calculation unit 104 may also calculate a plurality of kinds of feature values for the same time range.

Figure 8:
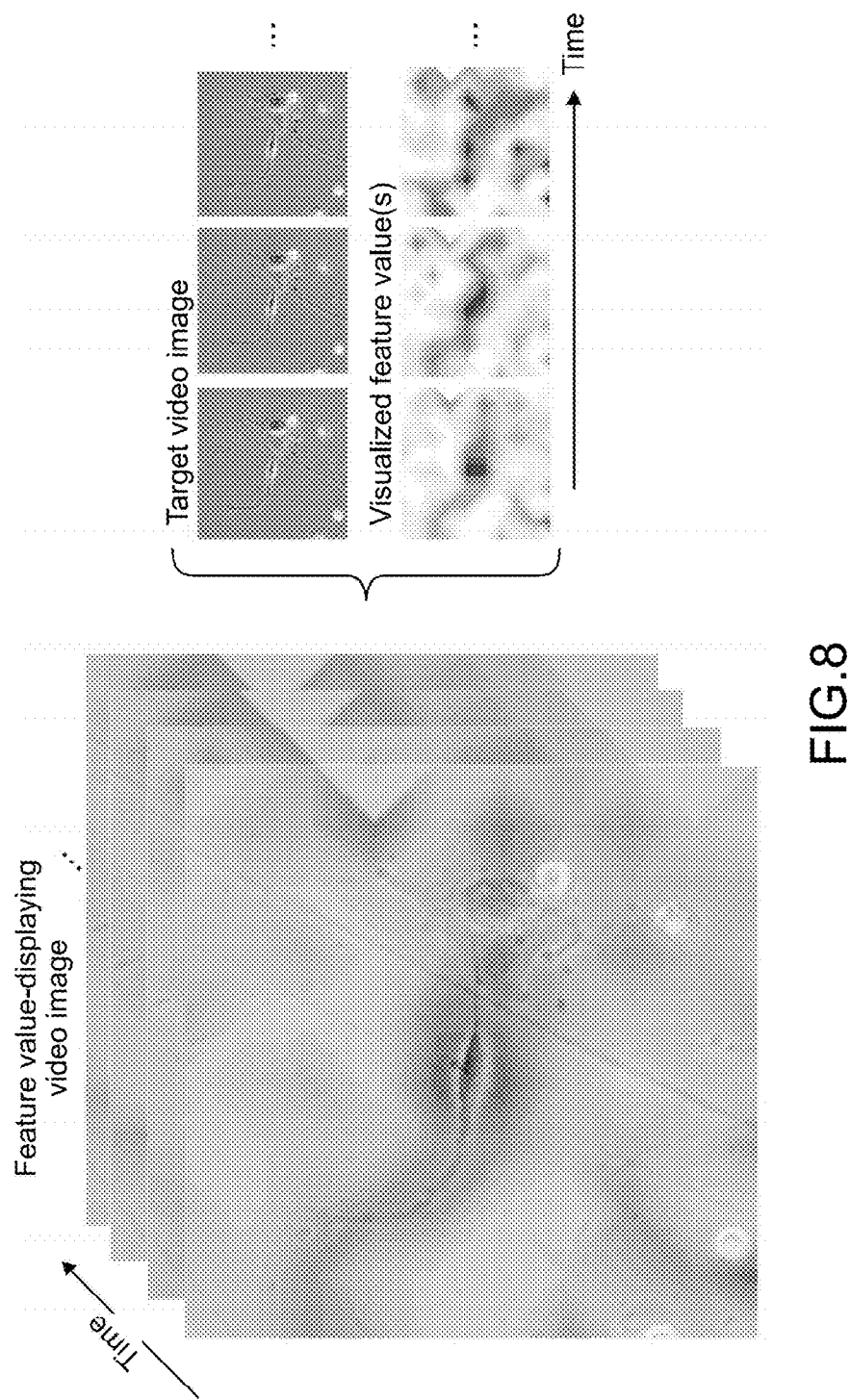
FIG. 8 is a schematic diagram showing generation of a feature value-displaying video image by a feature value display unit of the analyzing system.

The feature value display unit 105 visualizes temporal change or spatial change of the feature value. As a specific example, the feature value display unit 105 may visualize the feature value and superimposes the visualized feature value on the target video image to form a feature value-displaying video image (FIG. 2, St105). FIG. 8 is a schematic diagram showing how to generate the feature value-displaying video image. The feature value display unit 105 can visualize the feature value by applying coloring, or shading, in accordance with the magnitude of the feature value, to each position that corresponds to the calculation range where the feature value has been calculated. The feature value display unit 105 superimposes the visualized feature value to the frame of the target video image that corresponds to the time range where the feature value has been calculated, and generates the feature value-displaying video image.

The feature value-displaying video image shown in FIG. 8 is an example in which the MPF is calculated for each calculation range of the target video image being divided into 100 parts (see FIG. 4), and is superimposed to the target video image. The feature value display unit 105 may be configured to provide the generated feature value-displaying video image to a display, thereby allowing it to display the feature value-displaying video image. This allows a user to observe the target video image by referring to the feature of the amount of movement which is represented by the feature value.

Figure 9A:
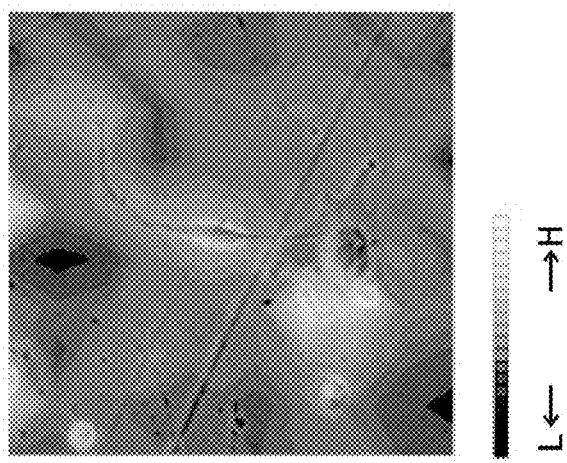
FIGS. 9A to 9C show an example of the feature value-displaying video image generated by the feature value display unit of the analyzing system.
Figure 9B:
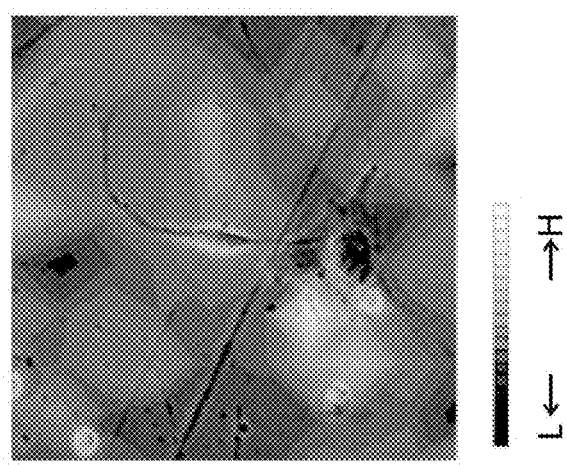
Figure 9C:
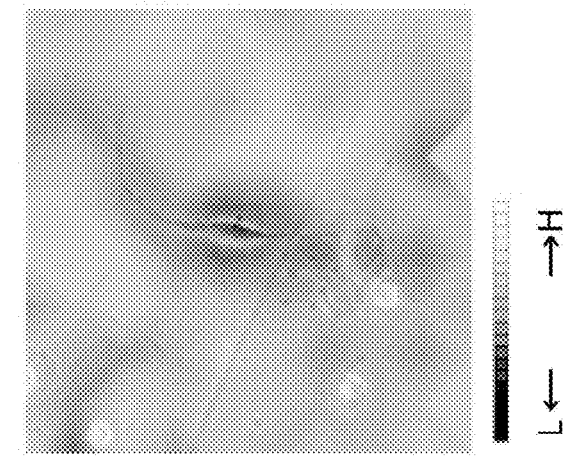

The feature value display unit 105 may generate the feature value-displaying video image by superimposing various feature values other than the MPF as well. FIGS. 9A to 9C show an example of the feature value-displaying video image obtained by superimposing a variety of feature values to the target video image. The feature values which are superimposed in FIGS. 9A, 9B, and 9C, respectively, are mean value of the amounts of movement, variance of the amounts of movement, and MPF (frequency). As shown in these figures, different characteristics can be observed with different kinds of feature values. This allows one to observe, for example, the characteristics such that the variance of the amounts of movement is relatively large in the vicinity of a cell process and that the frequency is relatively low in a cell body.

Figure 10A:
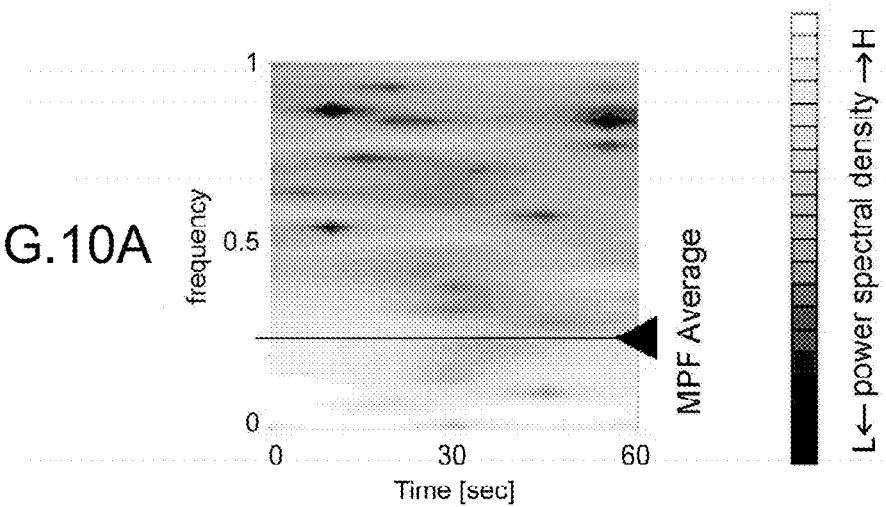
FIGS. 10A and 10B show an example of frequency characteristics for each time-window, displayed by the feature value display unit of the analyzing system.
Figure 10B:
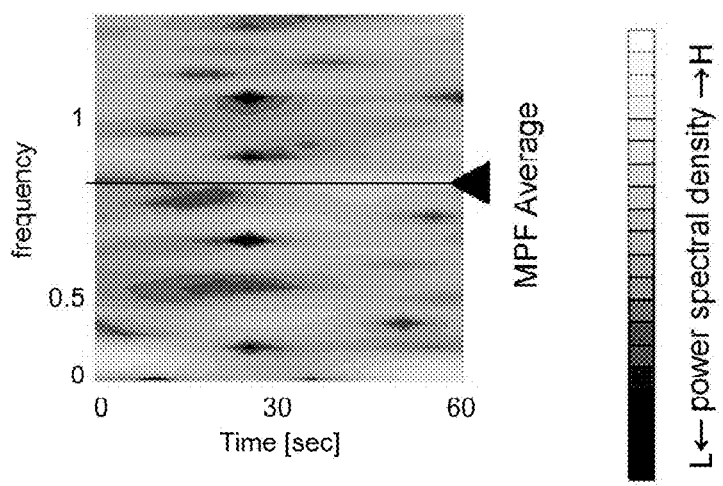

In addition, the feature value display unit 105 may allow frequency characteristics for each time-window mentioned above to be displayed, to visualize spatial change of the feature value (FIG. 2, St106). FIGS. 10A and 10B show an example of the frequency characteristics for each time window. FIG. 10A shows the frequency characteristics of nerve cells derived from iPS, treated with GABA. FIG. 10B shows the frequency characteristics of the nerve cells treated with glutamic acid.

GABA is a biologically active substance which functions as an inhibitory stimulus to nerve cells, and the nerve cells treated with GABA would show a motion with a low frequency (oscillation). Glutamic acid is a biologically active substance which functions as an excitatory stimulus to nerve cells, and the nerve cells treated with GABA would show a motion with a high frequency. In the frequency characteristics shown in FIG. 10A, the motion with the low frequency was activated, which indicates that the effect of GABA on nerve cells would be detectable.

Further, the feature value display unit 105 may display the feature value calculated by the feature value calculation unit 104 in a table or graph (FIG. 2, St107). FIG. 11 is an example of a table showing the feature values. The displayed table or graph of the feature values, as shown in the figure, would make it easier for a user to know the value and trends of the feature values.

The analyzing system 100 according to this embodiment is configured as described above. The analyzing system 100 enables the evaluation of motion of the target of analysis in the target video image, using the feature value. More specifically, the analyzing system 100 may be used in evaluation of effects of biologically active substances, effectiveness of drugs, evaluation of toxicity, quality control of nerve cells, evaluation of differentiation state of nerve cells, identification of abnormal cells and regions having abnormal networks, evaluation of pathological conditions by evaluating the cells derived from the pathological conditions, and the like.

The target of analysis by the analyzing system 100 is not specifically limited. Examples of suitable targets of analysis by the analyzing system 100 include nerve cells. The movement (oscillation, etc.) of nerve cells is likely to be influenced by the kind of stimulus (inhibitory, excitatory, etc.) being applied to the nerve cells and by the state of the formation of neuronal networks. However, the movement of nerve cells is very small compared to pulsation of cardiomyocytes and the like, and it demands higher accuracy in the analysis. As the analyzing system 100 is able to evaluate the motion of the cells with high accuracy using the feature value as an index, nerve cells can be a suitable target of analysis using this analyzing system.

Second Embodiment

An analyzing system according to a second embodiment of the present disclosure will be described.

Figure 12:
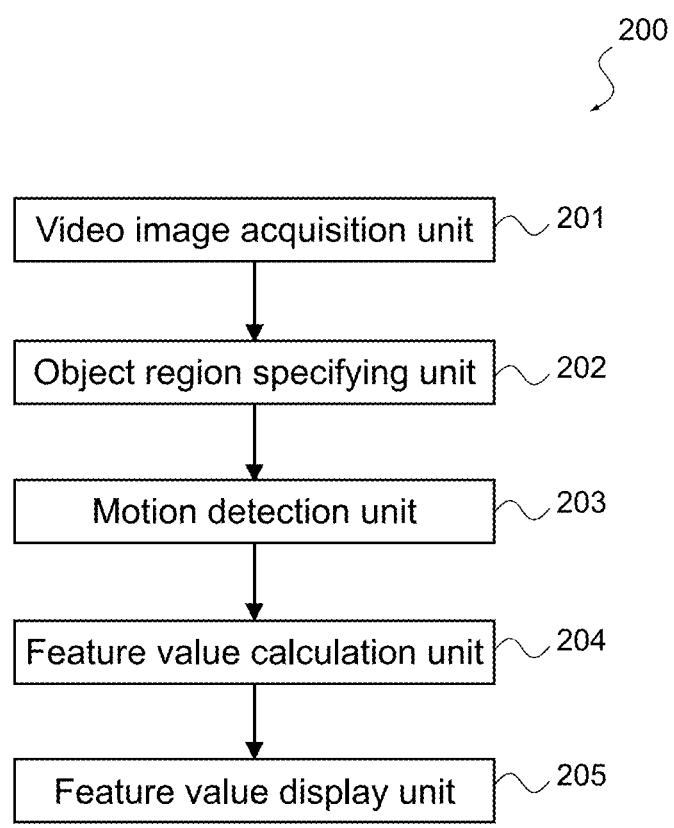
FIG. 12 is a schematic diagram showing a configuration of an analyzing system according to a second embodiment of the present disclosure.
Figure 13:
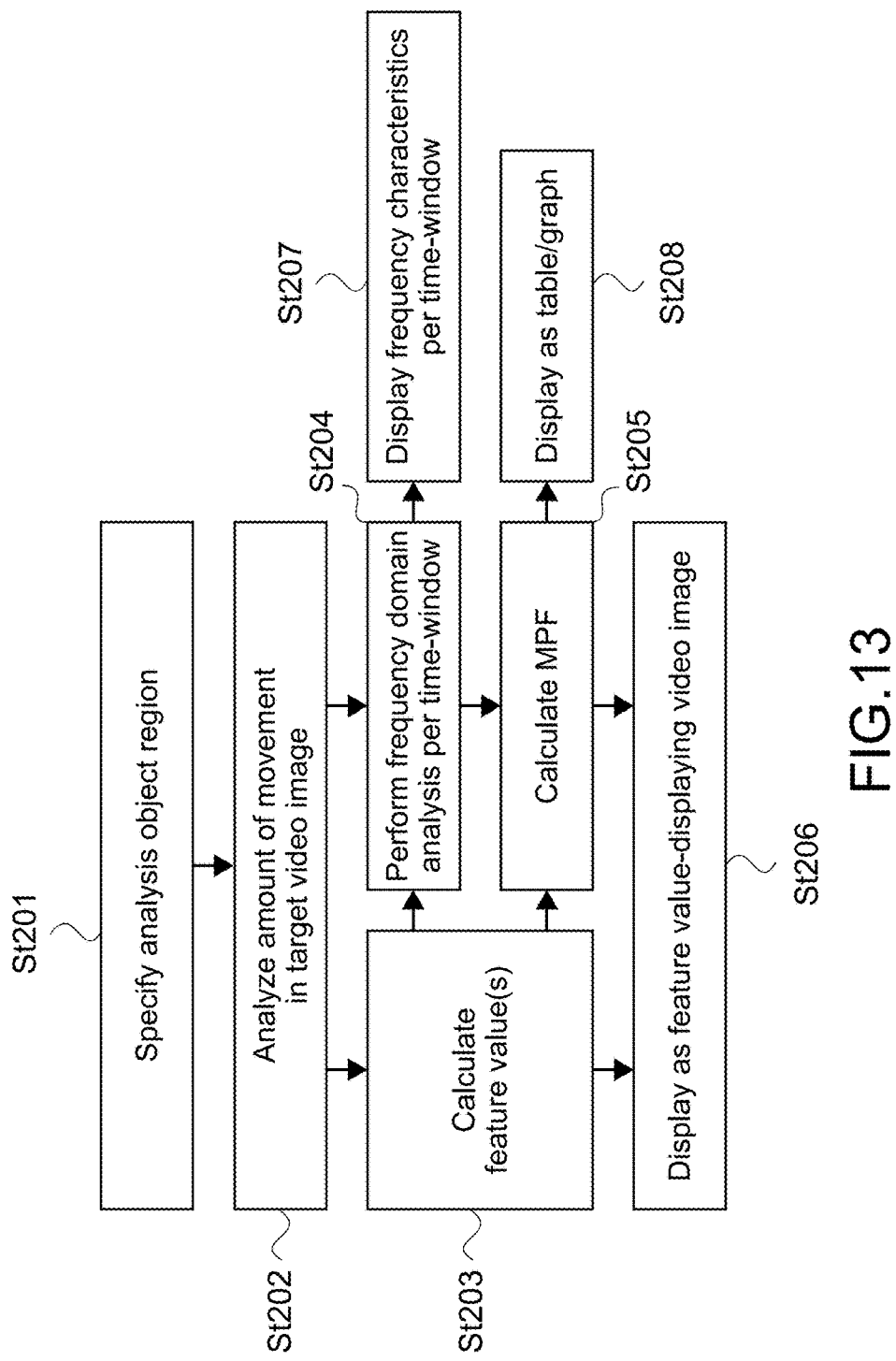
FIG. 13 is a flowchart showing an operation of the analyzing system.

FIG. 12 is a schematic diagram showing a configuration of an analyzing system 200 according to the embodiment. FIG. 13 is a flowchart showing an operation of the analyzing system 200. As shown in FIG. 12, the analyzing system 200 includes a video image acquisition unit 201, an object region specifying unit 202, a motion detection unit 203, a feature value calculation unit 204 and a feature value display unit 205. The analyzing system 200 may have a functional configuration realized by an information processor. It may be realized by a single information processor or a plurality of information processors connected via a network.

The video image acquisition unit 201 obtains a "target video image" which is a video image to analyze. A nonlimiting example of "target video image" is a video image of a cell or a group of cells as a target of analysis being imaged over time. The video image may include a video image made up of a plurality of frames continuously imaged, or still images from time-lapse imaging. The target video image may be obtained at a rate set appropriately depending on the target of analysis. In cases where the target of analysis is nerve cells, the rate may be 50 fps (frame/sec) or lower, and may be, for example, 1 fpm (frame/min). In cases where the target of analysis is cardiomyocytes, the rate may be 150 fps or more.

The target video image may be a video image obtained by imaging using any of various optical imaging methods such as bright-field imaging, dark-field imaging, phase difference imaging, fluorescence imaging, confocal imaging, multiphoton excitation fluorescence imaging, absorbed light imaging and scattered light imaging (see FIG. 3).

The video image acquisition unit 201 may obtain the target video image from an imaging apparatus (microscopic imaging apparatus) (not shown in the drawing), or, it may obtain as the target video image a video image stored in storage or a video image provided from a network. At this time, the video image acquisition unit 201 may obtain the target video image by sampling, at a predetermined period depending on type of the target of analysis, from the video images which have been imaged in advance. The video image acquisition unit 201 provides the obtained target video image to the object region specifying unit 202.

The object region specifying unit 202 specifies, in a still image included in the target video image (hereinafter referred to as a "target still image"), an "analysis object region" (FIG. 13, St201). The target still image may be the first frame of the target video image, or may be any frame. In addition, the target still image may be a frame extracted from the target video image at each predetermined time period. The analysis object region is a region where the target of analysis exists in the field of view of the target still image, which may be, for example, a region containing some cells.

Figure 14:
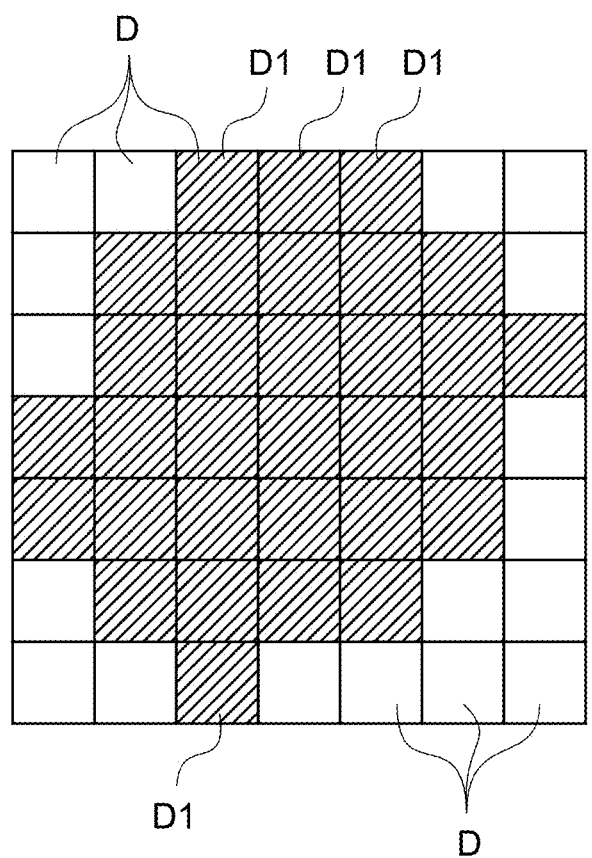
FIG. 14 is a schematic diagram showing an analysis object region specified by an object region specifying unit of the analyzing system.
Figure 15:
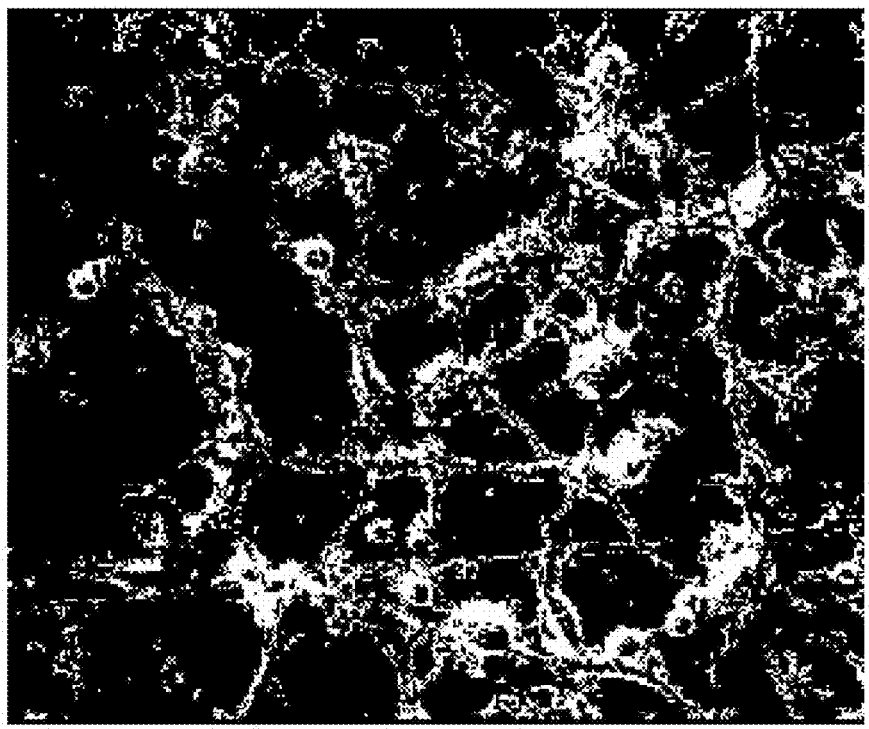
FIG. 15 shows an example of the analysis object region specified by the object region specifying unit of the analyzing system.

The object region specifying unit 202 performs image processing on the target still image and specifies the analysis object region. FIG. 14 is a figure showing schematically the analysis object region in the target still image. In the figure, each section D indicates a specific unit of the analysis object region, which unit may be a range including one or more pixels of the target still image. The sections D indicated by oblique lines are the sections specified by the object region specifying unit 202 as sections where the target of analysis exists, which will be referred to as analysis object sections D1. A set of analysis object sections D1 is the analysis object region. FIG. 15 shows an example of the analysis object region specified in the target still image. The white areas are the analysis object region.

The object region specifying unit 202 may specify the analysis object region by detection by dynamic ranges, matching or other image processing. At this time, the object region specifying unit 202 may select the target of analysis to detect as the analysis object region by the threshold. For example, it may select whether to detect cell bodies or neurites of nerve cells, or both of them.

The motion detection unit 203 detects an "amount of movement" (motion vector) in the target video image (FIG. 13, St202). The amount of movement may include amounts and directions of movement over time, of each pixel or group of pixels corresponding with one another between some frames included in the target video image. The amount of movement can be detected by an image-processing technique such as block matching.

At this time, the motion detection unit 203 detects the amount of movement in the analysis object region (the set of analysis object sections D1) specified by the object region specifying unit 202. Specifically, the motion detection unit 203 detects the amount of movement in the target video image from one frame of target still image to the next frame of target still image, for each analysis object section D1 included in the analysis object region. The motion detection unit 203 is capable of converting the amount of movement of each analysis object section D1 into a motion velocity.

Figure 16:
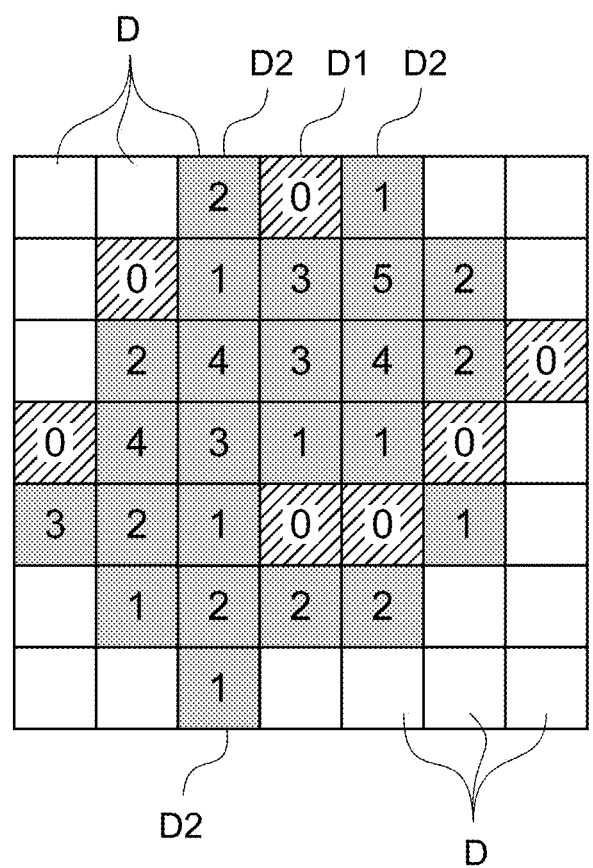
FIG. 16 is a schematic diagram showing motion velocities that a motion detection unit of the analyzing system detects from the analysis object region.
Figure 17:
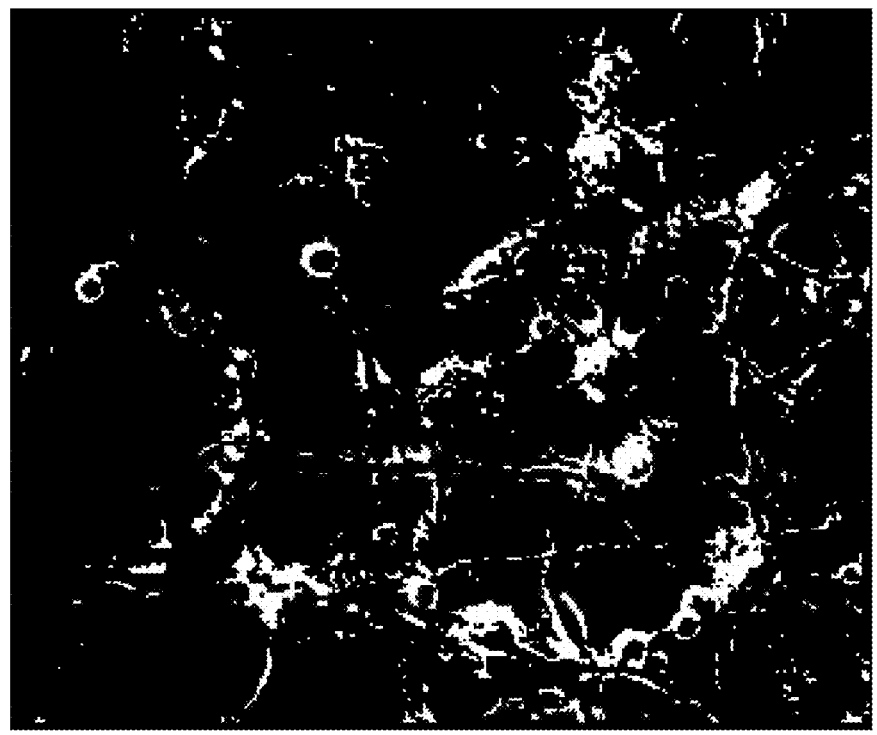
FIG. 17 is an example of a movement-containing region detected by the motion detection unit of the analyzing system.

FIG. 16 is a figure showing schematically the motion velocities of the target video image, which represents the motion velocities detected from the respective analysis object sections D1 by numerical values. Among the analysis object sections D1, the sections in which the motion velocity is equal to or greater than a certain value ("1" in this case) will be referred to as motion-detected sections D2. A set of motion-detected sections D2 is a movement-containing region. FIG. 17 is an example of the movement-containing region in the target video image. The movement-containing region is represented by the white areas.

As shown in FIG. 16, in the sections D that have not been specified as the analysis object sections D1 in the target still image (see FIG. 14), the amount of movement would not be detected. Therefore, in the region where the target of analysis does not exist (intervals between the cells, etc.) in the field of view of the target video image, the amount of movement would be not detected, and this makes it possible to detect the amount of movement feature value at high speed and also prevent generation of noise. The motion detection unit 203 provides the analysis object region, the movement-containing region and the amount of movement, to the feature value calculation unit 204.

The feature value calculation unit 204 calculates a "feature value" for the movement-containing region (FIG. 13, St203). The feature value is a value indicating a feature of the amount of movement for each time range, in the target video image. The time range may be a constant time range or a variable time range.

The feature value calculation unit 204 may calculate a "ratio of the movement-containing region" as the feature value. The ratio of the movement-containing region means the ratio of the movement-containing region to the analysis object region, which may be, for example, the ratio of the motion-detected sections D2 to the analysis object sections D1. The ratio of the movement-containing region makes it possible to determine how much of the region that has been determined to have the target of analysis (analysis object region) is the region in which the movement has occurred (movement-containing region). This enables one to determine that, for example, in cases where the ratio of the movement-containing region is large, the whole target of analysis (cells, etc.) is oscillating; and in cases where the ratio of the movement-containing region is small, a specific part of the target of analysis is oscillating.

In addition, the feature value calculation unit 204 may calculate an "analysis object region velocity" as the feature value. The analysis object region velocity is a mean value of motion velocities of the analysis object region, which can be calculated by averaging the motion velocities of the respective sections D1 (including the motion-detected sections D2). The analysis object region velocity is a mean value of the motion velocities of the whole target of analysis, which enables one to determine overall motion velocity of the target of analysis. By averaging the motion velocities of the region limited to the analysis object region, it can avoid averaging the motion velocities of the regions where the target of analysis does not exist (intervals between the cells, etc.).

The feature value calculation unit 204 may calculate a "movement-containing region velocity" as the feature value. The movement-containing region velocity is a mean value of motion velocities of the movement-containing region, which can be calculated by averaging the motion velocities of the respective motion-detected sections D2. The movement-containing region velocity is a mean value of the motion velocity of the moving parts of the target of analysis. For example, in cases where only a specific part in the target of analysis is vigorously oscillating, the movement-containing region velocity enables one to determine the motion velocity of this specific part alone. If a mean value of the motion velocities of the whole target of analysis was to be calculated, the motion velocities of the parts without movement would be averaged with it. In view of this, the movement-containing region velocity may be useful especially in cases where only a specific part of the target of analysis is moving.

Further, the feature value calculation unit 204 may calculate a "frequency feature value" as the feature value. The feature value calculation unit 204 may calculate the frequency feature value by calculating a time-motion waveform (see FIG. 5) as in the first embodiment and performing a frequency domain analysis of the time-motion waveform.

Figure 18:
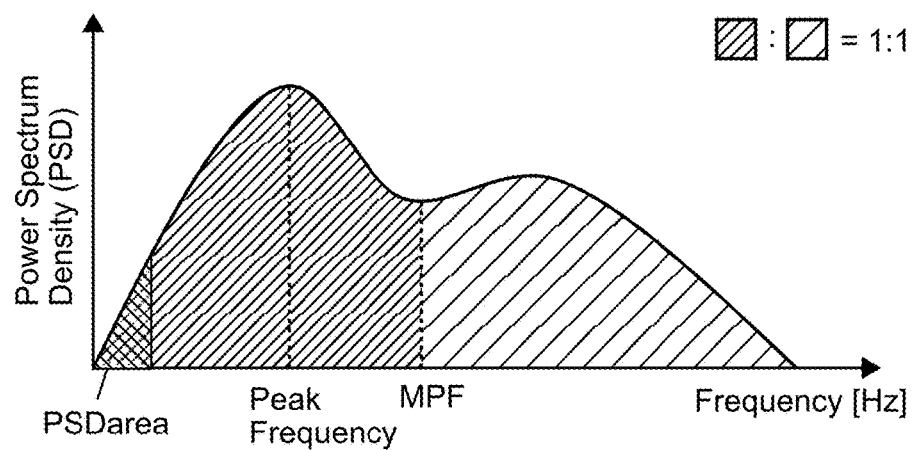
FIG. 18 is a schematic diagram showing a power spectral density calculated by a feature value calculation unit of the analyzing system.

The feature value calculation unit 204 performs fast Fourier transform (FFT) analysis of the waveform within the time-window while moving the time-window (FIG. 13, St204) and calculates a power spectral density (PSD) from the result of the analysis. FIG. 18 shows an example of the power spectral density.

As shown in the figure, the feature value calculation unit 204 may calculate an area of a predetermined frequency band of the power spectral density ("PSD area") as the frequency feature value. The frequency band to calculate the PSD area may be set appropriately depending on the frequency of the oscillation to observe, and may be, for example, from 0 to 0.1 Hz or less.

Figure 19A:
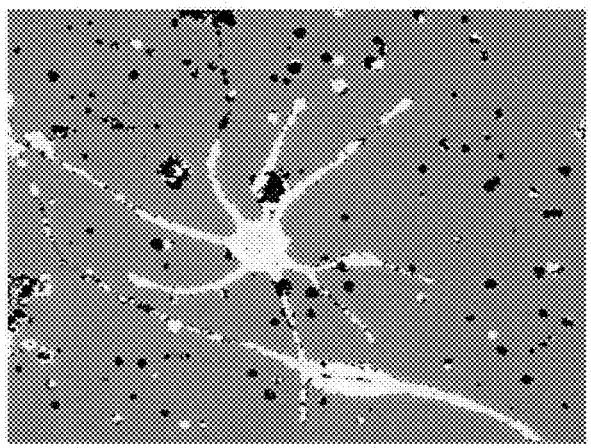
FIGS. 19A to 19C show an example which indicates feature values calculated by a feature value calculation unit of the analyzing system.
Figure 19B:
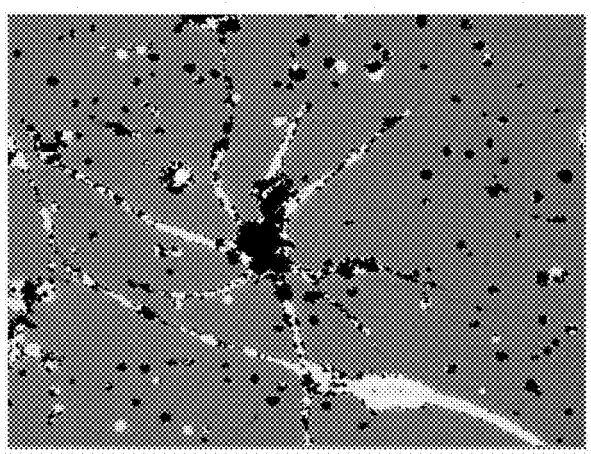
Figure 19C:
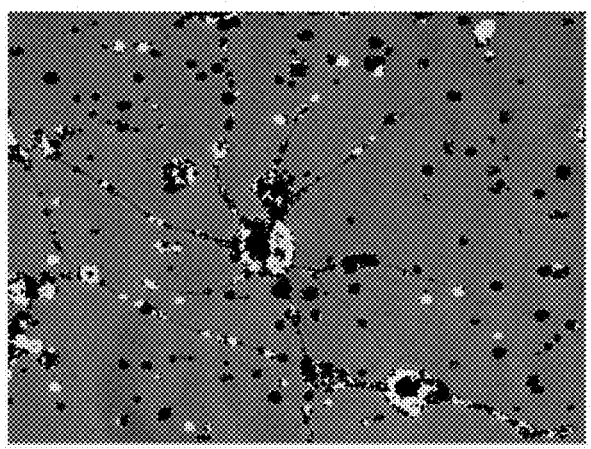

FIGS. 19A to 19C show an example of the PSD areas being mapped, which show a process of cell death in a nerve cell. FIGS. 19A, 19B, and 19C are the PSD areas of from 0 to 0.1 Hz, which are, respectively at the start time of the analysis, 0.75 hours later, and 6 hours later. In the figure, the white areas are the regions having large values of PSD area and the black areas are the regions having small values of PSD area. While the entire cell shows a relatively large oscillation of from 0 to 0.1 Hz in FIG. 19A, the oscillation of this frequency band is large in the neurites and the oscillation of this frequency band is small in the cell body in FIG. 19B. In FIG. 19C, the oscillation of this frequency band is also stopped in the neurites.

Thus, with the feature value calculation unit 204 calculating the PSD area of the predetermined frequency band, it is possible to extract, from the oscillation of the target of analysis, the oscillation at only a frequency band of interest. It is able to omit from the analysis the oscillations of the different frequencies which are unrelated.

In the same manner as in the first embodiment, the feature value calculation unit 204 may calculate mean intensity, peak frequency, mean power frequency (MPF) or the like, which can be obtained from the frequency domain analysis, as the frequency feature value (FIG. 13, St205). Examples of the frequency domain analysis include various frequency domain analysis techniques such as fast Fourier transform (FFT), wavelet transform, and maximum entropy method (MEM). The feature value calculation unit 204 provides the calculated feature to the feature value display unit 205. It should be noted that the feature value calculation unit 204 may also calculate a plurality of kinds of feature values for the same time range.

The feature value display unit 205 visualizes temporal change or spatial change of the feature value. As a specific example, the feature value display unit 205 may visualize the feature value and superimposes the visualized feature value on the target video image to form a feature value-displaying video image (FIG. 13, St206). In the same manner as in the first embodiment, the feature value display unit 205 can visualize the feature value by applying coloring, or shading, in accordance with the magnitude of the feature value, to each position that corresponds to the calculation range where the feature value has been calculated. The feature value display unit 205 superimposes the visualized feature value to the frame of the target video image that corresponds to the time range where the feature value has been calculated, and generates the feature value-displaying video image.

Figure 20:
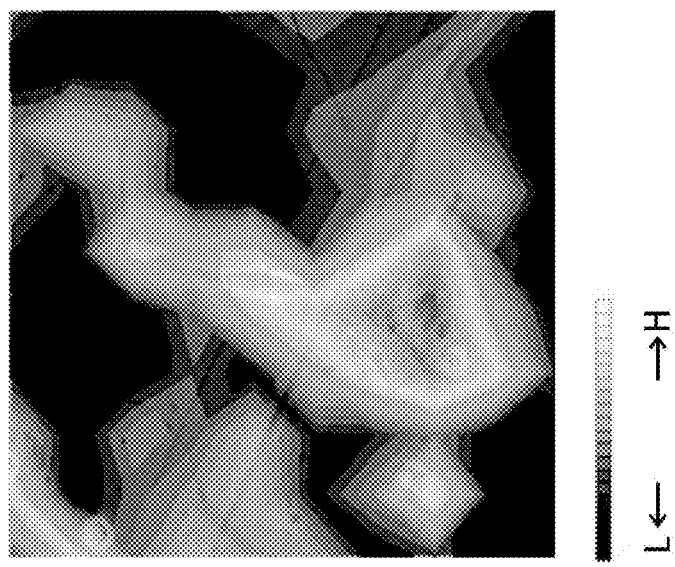
FIG. 20 shows an example of the feature value-displaying video image generated by the feature value display unit of the analyzing system.

FIG. 20 shows an example of the feature value-displaying video image obtained by superimposing the above-mentioned movement-containing region to the target video image. As shown in the figure, the feature value display unit 205 may provide the feature value-displaying video image by applying coloring and shading in accordance with the magnitude of the motion velocity (see FIG. 17). Further, the feature value display unit 205 may generate the feature value-displaying video image by using various feature values such as PSD area as shown in FIGS. 19A to 19C, mean value of the amounts of movement, variance of the amounts of movement and MPF as well (see FIGS. 9A to 9C). In addition, the feature value display unit 205 may allow frequency characteristics for each time-window mentioned above to be displayed, to visualize spatial change of the feature value (FIG. 13, St207).

Figures 21, 22:
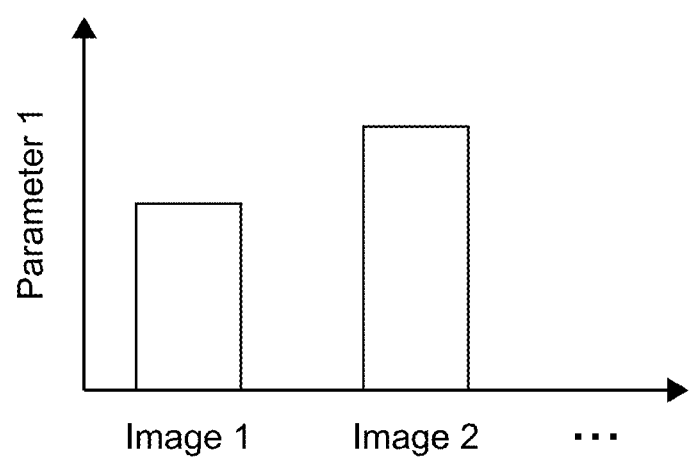
FIG. 21 shows an example of a feature value table displayed by the feature value display unit of the analyzing system.
FIG. 22 shows an example of a feature value graph displayed by the feature value display unit of the analyzing system.
Figure 23:
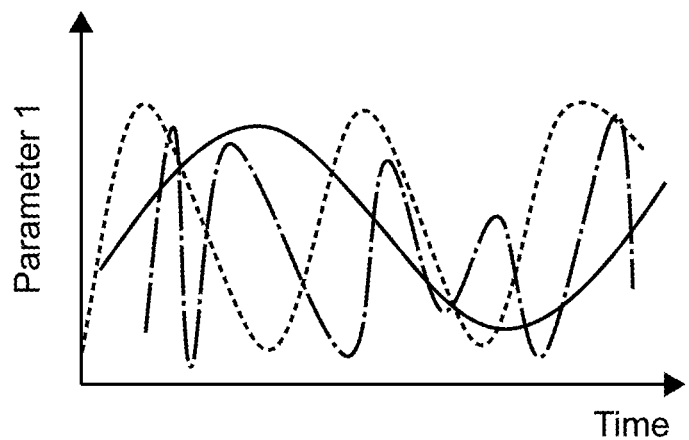
FIG. 23 shows an example of a feature value graph displayed by the feature value display unit of the analyzing system.
Figure 24:
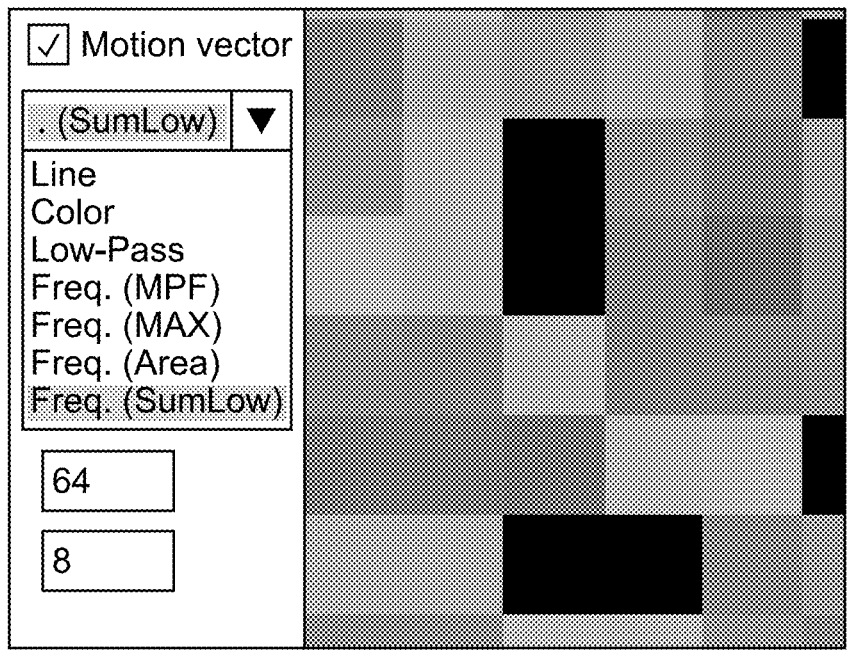
FIG. 24 shows an example of an interface for selecting feature values displayed by the feature value display unit of the analyzing system.
Figure 25:
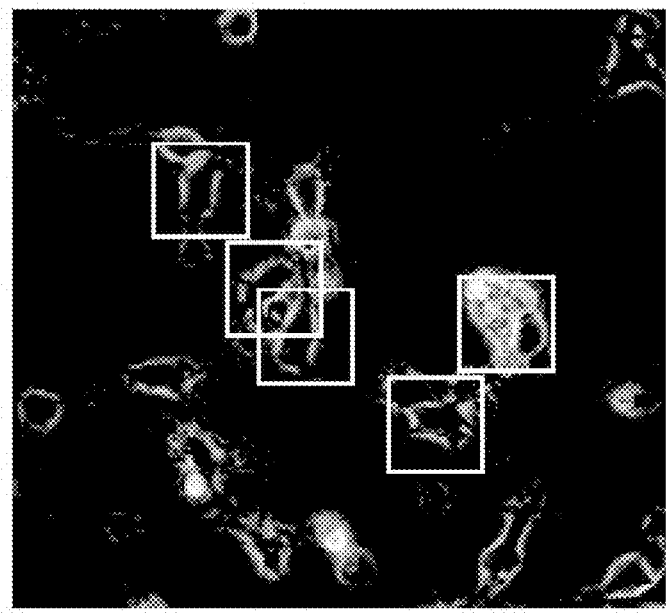
FIG. 25 shows an example of an interface for selecting feature values displayed by the feature value display unit of the analyzing system.

Further, the feature value display unit 205 may display the feature value calculated by the feature value calculation unit 204 in a table or graph (FIG. 13, St208). FIGS. 21 to 23 are examples of display modes of the feature values displayed by the feature value display unit 205. FIG. 24 shows an interface for selecting feature values to display by the feature value display unit 205. FIG. 25 shows an interface for selecting ROI (Region of Interest, white frames in the figure) in which the feature value would be displayed. The feature value display unit 205 may be configured to display the target of analysis and the feature value as instructed by the interfaces shown in FIGS. 24 and 25. In addition, the feature value display unit 205 may also automatically select the ROI by using the above-mentioned analysis object region, movement-containing region, variety of feature values, or the like.

The analyzing system 200 according to this embodiment is configured as described above. The analyzing system 200 enables the evaluation of motion of the target of analysis in the target video image, using the feature value. More specifically, the analyzing system 200 may be used in evaluation of effects of biologically active substances, effectiveness of drugs, evaluation of toxicity, quality control of nerve cells, evaluation of differentiation state of nerve cells, identification of abnormal cells and regions having abnormal networks, evaluation of pathological conditions by evaluating the cells derived from the pathological conditions, and the like.

The target of analysis by the analyzing system 200 is not specifically limited. Examples of suitable targets of analysis by the analyzing system 200 include nerve cells. The movement (oscillation, etc.) of nerve cells is likely to be influenced by the kind of stimulus (inhibitory, excitatory, etc.) being applied to the nerve cells and by the state of the formation of neuronal networks. However, the movement of nerve cells is very small compared to pulsation of cardiomyocytes and the like, and it demands higher accuracy in the analysis. As the analyzing system 200 is able to evaluate the motion of the cells with high accuracy using the feature value as an index, nerve cells can be a suitable target of analysis using this analyzing system.

In addition, this embodiment extracts as the analysis object region the region where the target of analysis exists in the target video image and performs the analysis of the amount of movement and the calculation of the feature value for the analysis object region. In nerve cells, their parts which may oscillate are relatively local compared to those of other cells such as cardiomyocytes, and they can be effectively analyzed using the analysis object region of the analyzing system 200 according to this embodiment. Further, since the analyzing system 200 uses the area of the specific frequency band of the power spectral density in the analysis, it is able to extract from neurites and cell bodies of nerve cells, or the like, respective oscillations of different frequencies. In this respect, it is suitable for the analysis of nerve cells.

The present disclosure is not limited to each of the foregoing embodiments but can be modified within the scope without departing from the gist of the present disclosure.

The present disclosure may employ the following configurations.

(1) An analyzing system including:

a feature value calculation unit configured to calculate, for each time range, a feature value indicating a feature of an amount of movement in a target video image in which a target of analysis is imaged over time.

(2) The analyzing system according to (1), further including:

a feature value display unit configured to visualize temporal change or spatial change of the feature value.

(3) The analyzing system according to (2), in which the feature value display unit is configured to visualize temporal change of the feature value and superimpose the visualized temporal change of the feature value on the target video image to form a feature value-displaying video image.

(4) The analyzing system according to any one of (1) to (3), further including:

a range-specifying unit configured to specify a certain range of the target video image as a calculation range;

the feature value calculation unit being configured to calculate the feature value for each calculation range.

(5) The analyzing system according to any one of (1) to (4), in which the feature value is any one selected from the group consisting of mean value, maximum value, minimum value, standard deviation, variance, and variation coefficient of amounts or directions of movement; a frequency feature value; or a combination thereof.

(6) The analyzing system according to any one of (1) to (5), in which the frequency feature value is mean intensity, peak frequency or mean power frequency, obtained from a frequency domain analysis.

(7) The analyzing system according to any one of (1) to (6), which analyzes a nerve cell as the target of analysis.

(8) The analyzing system according to any one of (1) to (7), further including:

an object region specifying unit configured to specify, in a still image included in the target video image, an analysis object region which is a region where the target of analysis exists;

the feature value calculation unit being configured to calculate the feature value for the analysis object region in the target video image.

(9) The analyzing system according to (8), in which the feature value calculation unit is configured to calculate the feature value in the analysis object region using a movement-containing region which is a region that has a motion velocity equal to or greater than a threshold.

(10) The analyzing system according to (9), in which the feature value calculation unit is configured to calculate, as the feature value, a ratio of the movement-containing region to the analysis object region.

(11) The analyzing system according to (9) or (10), in which the feature value calculation unit is configured to calculate, as the feature value, a mean value of motion velocities of the analysis object region.

(12) The analyzing system according to any one of (9) to (11), in which the feature value calculation unit is configured to calculate, as the feature value, a mean value of motion velocities of the movement-containing region.

(13) The analyzing system according to any one of (1) to (12), in which the feature value calculation unit is configured to calculate, as a frequency feature value, an area of a predetermined frequency band of a power spectral density obtained from a frequency domain analysis of the amount of movement.

(14) An analyzing program which causes a computer to function as:

a feature value calculation unit configured to calculate, for each time range, a feature value indicating a feature of an amount of movement in a target video image in which a target of analysis is imaged over time.

(15) An analyzing method including:

calculating, for each time range, a feature value indicating a feature of an amount of movement in a target video image in which a target of analysis is imaged over time.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An information processing apparatus comprising:
a processor configured to:
determine a frequency feature value based on motion data from an image of a cell, and
control displaying information associated with the frequency feature value,
wherein the frequency feature value includes a power spectral density for each time range and each frequency band, and wherein the information associated with the frequency feature value is displayed in association with the each time range and the each frequency band.

2. The information processing apparatus according to claim 1, wherein the information associated with the frequency feature value is displayed in a two dimensional graph, and wherein a first axis of the two dimensional graph represents a time range and a second axis of the two dimensional graph represents a frequency band.

3. The information processing apparatus according to claim 1, wherein the frequency feature value further includes at least one of mean intensity, peak frequency or mean power frequency.

4. The information processing apparatus according to claim 1, wherein the information associated with the frequency feature value includes coloring or shading based on magnitude of the frequency feature value.

5. The information processing apparatus according to claim 1, wherein the image includes a frame image obtained from a video image by imaging the cell over time.

6. The information processing apparatus according to claim 5, wherein the frequency feature value is determined for each time range of the video data, and wherein the information associated with the frequency feature value is displayed on the video image.

7. The information processing apparatus according to claim 1, wherein the cell is a nerve cell.

8. The information processing apparatus according to claim 1, wherein the motion data includes at least one of motion amount and motion vector.

9. The information processing apparatus according to claim 1, wherein the frequency feature value is determined for each of blocks, and the blocks include at least a part of the motion data.

10. The information processing apparatus according to claim 1, wherein the processor is configured to set a certain range in the image and the frequency feature value is determined for the certain range.

11. The information processing apparatus according to claim 10, wherein the processor is configured to set a region that has a motion amount equal to or greater than a threshold of the certain range.

12. The information processing apparatus according to claim 1, wherein a mean power frequency is larger than a peak frequency obtained from a frequency domain analysis.

13. An information processing method comprising:
determining a frequency feature value based on motion data from an image of a cell, and
controlling displaying information associated with the frequency feature value,
wherein the frequency feature value includes a power spectral density for each time range and each frequency band, and wherein the information associated with the frequency feature value is displayed in association with the each time range and the each frequency band.

14. A cell analysis system comprising:
an imaging apparatus configured to image a cell;
an information processing apparatus configured to determine a frequency feature value based on motion data from cell image obtained by the image capturing apparatus; and
a display configured to display information associated with the frequency feature value,
wherein the frequency feature value includes a power spectral density for each time range and each frequency band, and wherein the information associated with the frequency feature value is displayed in association with the each time range and the each frequency band.

15. The cell analysis system according to claim 14, wherein the imaging apparatus is a microscopy apparatus.

16. The cell analysis system according to claim 14, wherein the cell is a nerve cell.

17. The cell analysis system according to claim 14, wherein the frequency feature value includes at least one of mean intensity, peak frequency or mean power frequency.

18. The cell analysis system according to claim 14, wherein the information associated with the frequency feature value includes coloring or shading based on magnitude of the frequency feature value.

19. The information processing apparatus according to claim 14, wherein a mean power frequency is larger than a peak frequency obtained from a frequency domain analysis.

* * * * *